United States Patent [19]
Aoyama

[11] Patent Number: 6,150,221
[45] Date of Patent: Nov. 21, 2000

[54] SEMICONDUCTOR DEVICE AND METHOD FOR MANUFACTURING SAME

[75] Inventor: Tohru Aoyama, Tokyo, Japan

[73] Assignee: NEC Corporation, Tokyo, Japan

[21] Appl. No.: 09/026,494

[22] Filed: Feb. 20, 1998

[30]     Foreign Application Priority Data

Feb. 20, 1997 [JP] Japan .................................. 9-036467

[51] Int. Cl.⁷ .............................................. H01L 21/336
[52] U.S. Cl. ........................................ 438/300; 438/303
[58] Field of Search ................................. 438/231, 552, 438/199, 34, 162, 300, 442, 301, 303, 547; 257/63, 65, 616

[56]         References Cited

U.S. PATENT DOCUMENTS

| | | | |
|---|---|---|---|
| 5,668,024 | 9/1997 | Tsai et al. | 438/199 |
| 5,683,920 | 11/1997 | Lee | 437/34 |
| 5,707,896 | 1/1998 | Chiang et al. | 438/231 |
| 5,753,548 | 5/1998 | Yu et al. | 438/231 |
| 5,955,745 | 7/1999 | Yamazaki | 257/63 |

FOREIGN PATENT DOCUMENTS 5-55250  3/1993  Japan .
8-167718 6/1996  Japan .

OTHER PUBLICATIONS

Fair, Richard B., "The Role of Transient Damage Annealing in Shallow Junction Formation", *Nuclear Instruments and Methods in Physics Research* B37/38 (1989)371–378, North Holland, Amsterdam.

*Primary Examiner*—Matthew Smith
*Assistant Examiner*—Calvin Lee
*Attorney, Agent, or Firm*—Hutchins, Wheeler & Dittmar

[57]           ABSTRACT

It is an object of the invention to provide a CMOS device comprising p-channel FETs having shallow source and drain regions and a method for fabricating the same. A B-doped selective epitaxial layer is grown only on an area, where the source and drain regions of the p-channel FET is to be formed. Growth of the B-doped selective epitaxial layer on an area, where the source and drain regions of a n-channel FET is to be formed, is impeded by forming a amorphous region on the area corresponding to the n-channel FET.

26 Claims, 5 Drawing Sheets

SEMICONDUCTOR DEVICE AND METHOD FOR MANUFACTURING SAME

The invention relates to a semiconductor device and a method for fabricating the same, and especially to a field effect transistor obtained by selectively growing EL Si epitaxial layer on a surface of a Si-substrate, where source and drain regions are to be formed, and a method for fabricating the same.

BACKGROUND OF THE INVENTION

According to the present situation that bit rate of information to be processed by a field effect transistor (FET, hereinafter) is remarkably increasing and requirement for miniaturizing the FET becomes noticeable, development of the FET having a short channel is regarded as important. In conformity with the aforementioned tendency, it becomes necessary to form the shallow source and drain junctions of the FET. As a process for forming the shallow source and drain regions of the FET, a method for selectively growing a Si epitaxial layer on a substrate, where the source and drain regions are to be formed, has been proposed. Although it is important to establish methods for forming the shallow source and drain junctions for both the n- and p-channel FETs, formation of the same for the p-channel FET is especially difficult.

If B or $BF_3$ ions are implanted on the Si epitaxial layer and thermal treatment is applied thereto, the source and drain regions of the p-channel FET can be formed, but the shallow junctions cannot be obtained for the reason mentioned later.

If B is substituted for n-type impurity, such as P or As, the source and drain regions of an n-channel FET can be formed. The depth of the source and drain junctions of the n-channel FET thus obtained are shallower than those of the p-channel FET obtained by B ion implantation, because diffusion constant of the n-type impurity, such as P or As, in the implanted Si-substrate is smaller than that of B.

However, it is known that if the Si epitaxial layer for the p-channel FET is doped with B and this impurity is thermally diffused into the Si-substrate, a shallow source and drain junctions of the p-channel FET can be obtained.

In order to fabricate a complementary metal oxide semiconductor (COMS, hereinafter) device with the shallow source and drain junctions, it is extremely desirable to combine the two aforementioned methods for forming the source and drain junctions respectively suited for the n- and p-channel FETs.

SUMMARY OF THE INVENTION

Accordingly, it is an object of the invention provide a CMOS device having shallow source and drain junctions of p-channel FETs.

It is a further object of the invention to provide a method for fabricating a CMOS device having shallow source and drain junctions of the p-channel FETs by amorphizing parts of a substrate corresponding to source and drain junctions of n-channel FETs.

It is a still further object of the invention to provide a method for fabricating a CMOS device having shallow source and drain junctions of the p-channel FETs by introducing dry-etching defects to parts of the substrate corresponding to the source and drain junctions of the n-channel FETs.

According to the first feature of the invention, a CMOS device comprises;

one or more n-type field effect transistors (FETs, hereinafter), each of which comprising;
   a first gate electrode formed on a substrate via an insulator layer,
   a first side wall surrounding the first gate electrode, first source and drain regions formed by n-type impurity-doping on the substrate surrounding the first gate electrode; and one or more p-type FETs, each of which comprising;
   a second gate electrode formed on the substrate via the insulator layer,
   a second side wall surrounding the second gate electrode,
   second source and drain regions formed by p-type impurity-doping on the substrate surrounding the second gate electrode, and
   a p-type impurity doped epitaxial layer grown only on the second source and drain regions.

According to the second feature of the invention, a method for fabricating a CMOS device comprises the steps of;

forming an insulator layer on a surface of a substrate,
   forming gate electrodes on the insulator layer,
   forming side walls surrounding the gate electrodes,
   exposing only areas surrounding the gate electrodes on the surface of the substrate, where n-type impurity ions are to be implanted, by processing photoresists,
   implanting n-type impurity ions on the exposed areas on the surface of the substrate,
   introducing dry etching defects to the exposed areas on the surface of the substrate,
   growing p-type impurity doped selective epitacial layers on areas surrounding the side walls on the surface of the substrate, where p-type impurity ions are to be doped, and
   forming source and drain regions by diffusing the p-type impurity into the surface of the substrate from the p-type impurity doped selective epitaxial layers.

According to the third feature of the invention, a method for fabricating a CMOS device comprises the steps of;

forming an insulator layer on a surface of a substrate,
   forming gate electrodes on the insulator layer,
   forming side walls surrounding the gate electrodes,
   exposing only areas surrounding the gate electrodes on the surface of the substrate, where n-type impurity ions are to be implanted, by processing photoresists,
   implanting n-type impurity ions on the exposed areas,
   introducing dry etching defects to the exposed areas on the surface of the substrate,
   growing p-type impurity doped selective epitaxial layers on areas surrounding the side walls on the surface of the substrate, where p-type impurity ions are to be doped, and
   forming source and drain regions by diffusing the p-type impurity into the surface of the substrate from the p-type impurity doped selective epitaxial layers.

BRIEF DESCRIPTION OF THE DRAWINGS

The invention will be explained in more detail in conjunction with appended drawings, wherein.

DESCRIPTION OF THE PREFERRED EMBODIMENTS

Figure 1A:
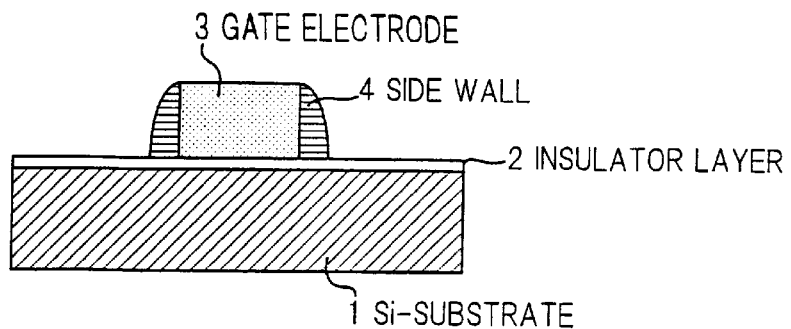
FIGS. 1A to 1D are cross-sectional views for showing a conventional method for fabricating a CMOS device.
Figure 1B:
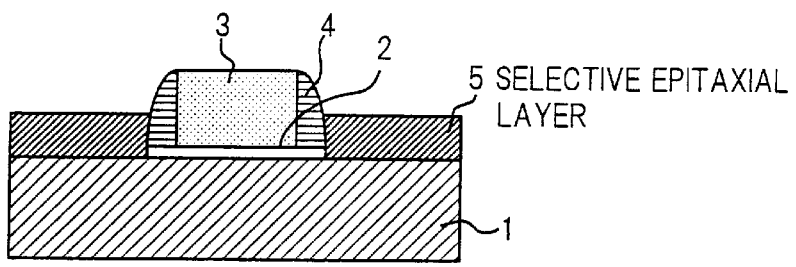
Figure 1C:
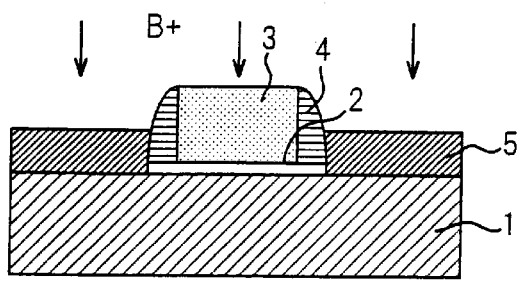
Figure 1D:
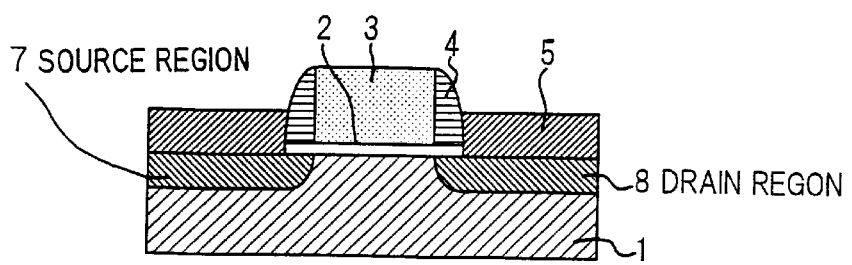

Before explaining a semiconductor device and methods for fabricating the same in the preferred embodiments according to the invention, the aforementioned conventional semiconductor devices and the methods for fabricating the same will be explained in conjunction with appended drawings.

For example, a proposal disclosed in Japanese Patent Kokai 5-55250 on this subject will be explained as follows.

As shown in FIGS. 1A to 1D, a 1000–2000 Å thick epitacial layer 5 is grown on a Si substrate 1 by reducing $SiH_2Cl_2$ by $H_2$, B or $BF_3$ ions are implanted thereon, and a source region 7 and a drain region 8, which are 3000 Å deep under the surface of the Si substrate 1, can be formed. In FIGS. 1A to 1D, 2 is an insulator layer, 3 is a gate electrode and 4 is a side wall.

Moreover, a p-channel FET can be fabricated by a similar process by changing kind of implanted ion. However, diffusion of P or As, each being impurity of n-type, is slow as compared with that of B. Accordingly, the depth of the source and drain junctions of the n-channel FET are about 1500 Å and sufficiently shallow as compared with those of the p-channel FET even in case that the selective epitaxial layer 5 is omitted.

In case that a CMOS device comprising both the n- and p-channel FETs is fabricated by the conventional process, ions must be separately implanted on the n- and p-channel FETs by using photoresists 6, after the selective epitaxial layer 5 is grown on the Si-substrate 1.

Figure 2A:
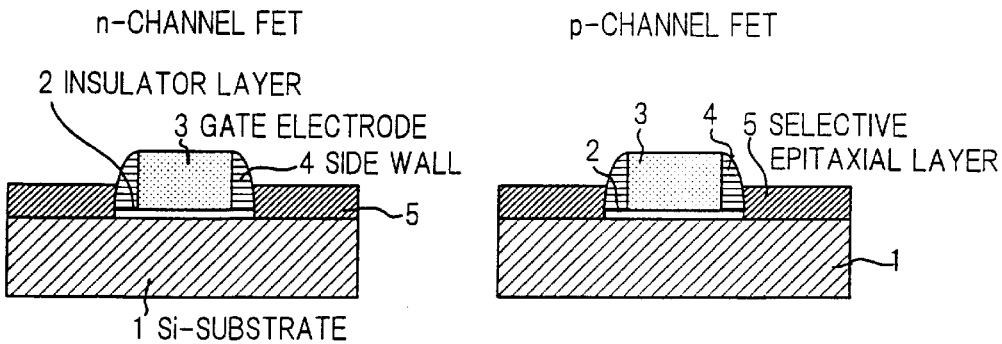
FIGS. 2A to 2D are cross-sectional views for showing a conventional method for fabrication p- and n-channel CMOs devices.

FIGS. 2A to 2D show flow charts of the fabrication process of a CMOS device by the conventional method, which separately explain both the cases of the n- and p-channel FETs. As shown in FIG. 2A, insulators 2, gate electrodes 3 and side walls 4 are respectively formed for the n-channel and p-channel FETs similarly to the case of FIGS. 1A to 1D. Thereafter, a selective epitaxial layer 5 is grown on a Si substrate 1.

Figure 2B:
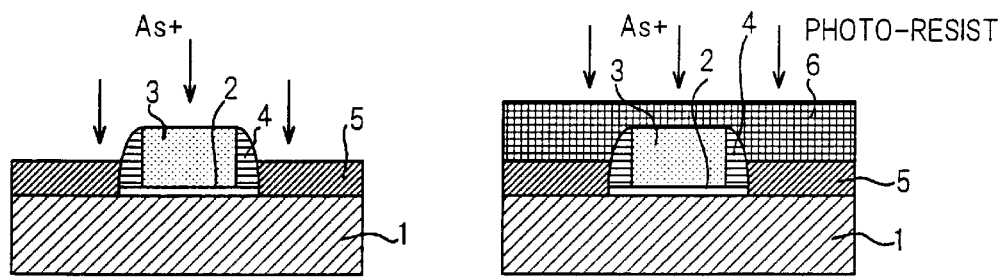

Next, as shown in FIG. 2B, a photoresist 6 covering an area corresponding to the p-channel FET is formed, n-type ions, such as P or As ions, are implanted only on an area corresponding to the n-channel FET, and a source region 7 and a drain region 8 of the n-channel FET are formed.

Figure 2C:
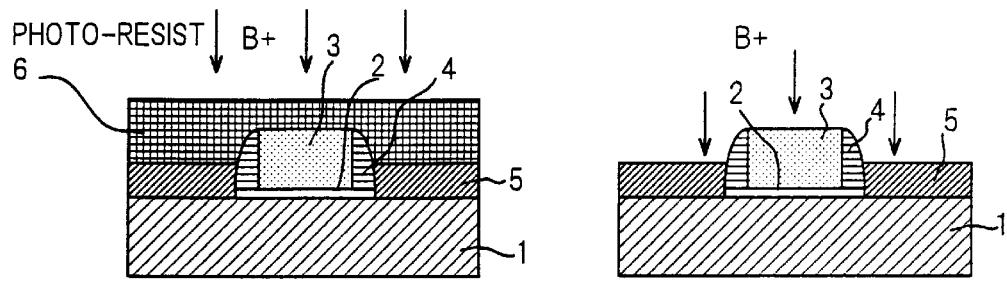
Figure 2D:
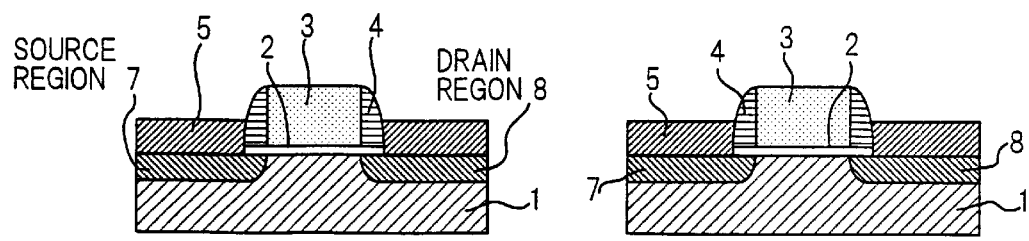

Conversely, as shown in FIG. 2C, in case that B and $BF_3$ ions are implanted on an area corresponding to source and drain regions of the p-channel FET, the area corresponding to the n-channel FET is covered with a photoresist 6. Thereafter, as shown in FIG. 2D, implanted ions are activated by thermal treatment, and both the n- and p-channel FETs are fabricated.

In the aforementioned process for fabricating the p-channel FET by implanting B or $BF_3$ ions on the selective epitaxial layer, there arises a problem that the depths of the junctions are increased by enhanced diffusion of B.

Richard B. Fair has given an interpretation on the aforementioned phenomenon on Nuclear Instruments Method in Physics Research, B 37/38, 1989, p.371–378, that interstitial Si atoms caused by B ion implantation enhance diffusion of B.

As a method for forming the shallow junctions avoiding enhanced diffusion, there is a method by which a B doped selective epitaxial layer for a p-channel FET is grown on the substrate and the source and drain regions are formed by thermal diffusion of B therefrom.

Figure 3A:
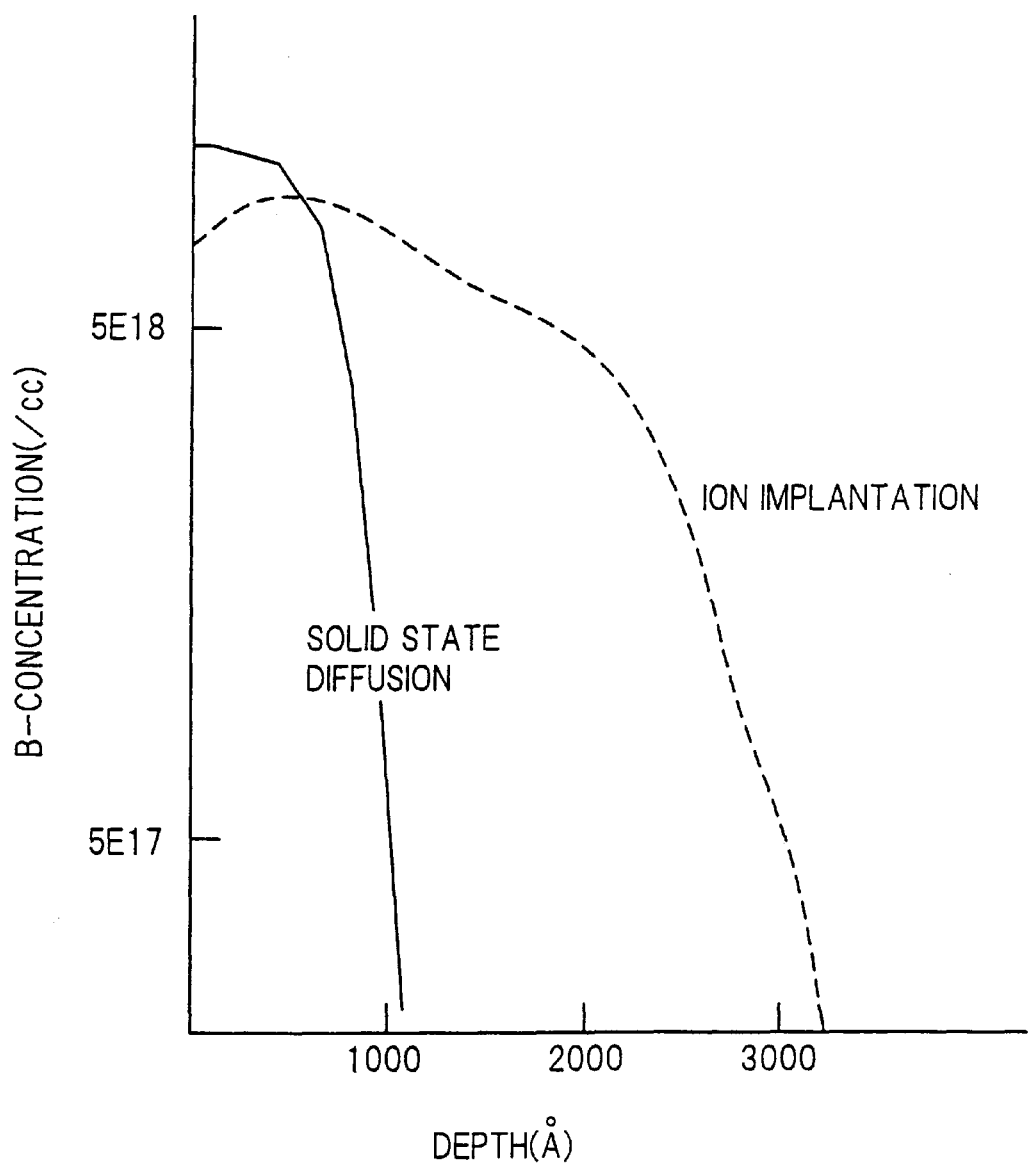
FIG. 3 is a SIMS profile of B for showing the difference between thermal diffusion and ion implantation.

As shown in FIG. 3, the depth of the B-doped junction obtained by thermal diffusion from the B-doped epitaxial layer is reduced to one-third of that obtained by B ion implantation, where concentration of B at the bottom of the junction is regarded as $5 \times 10^{17}$/cc.

Although the p-channel FETs can be fabricated by the aforementioned process, when it is applied to fabrication of a CMOS, a B-doped epitaxial layer is formed on the n-channel FETs also. Accordingly, this process cannot be applied to fabrication of the CMOS on account of this problem.

Next, embodiments of the invention will be explained referring to the appended drawings.

Figure 4A:
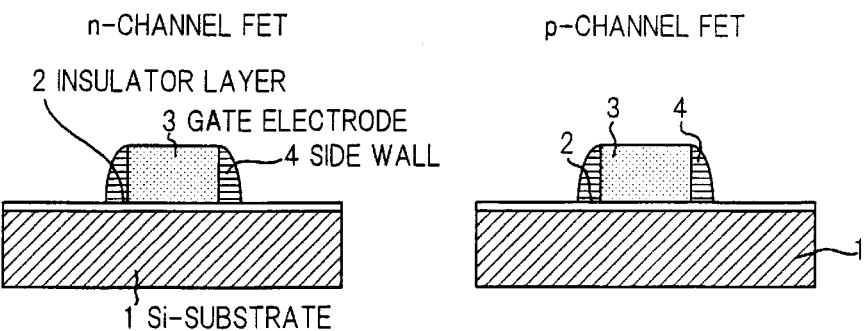
FIGS. 4A to 4D are cross-sectional views for showing a method for fabricating a semiconductor device in the first preferred embodiment shown following the sequence of process.

FIGS. 4A to 4D are cross-sectional views for explaining a fabrication process of a semiconductor device according to the invention, where explanations are given for both n- and p-channel FETs composing a CMOS following the sequence of process. As shown in FIG. 4A, insulator layers 2, gate electrodes 3 and side walls 4 have been fabricated for both n- and p-channel FETs similarly to the conventional process.

Figure 4B:
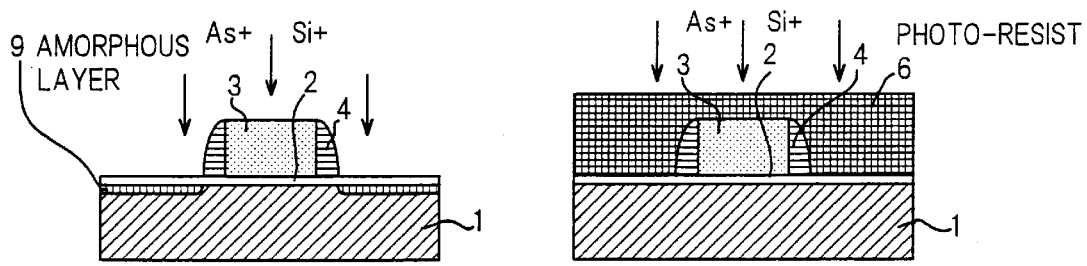

Next, as shown in FIG. 4B, a photoresist 6 is patterned on a surface of a Si-substrate 1 for the p-channel FET so that only an area, on which both source and drain regions of the n-channel FET are to be formed, is exposed and P or As ions are implanted thereon under condition that implant energy and dose amount are respectively 50 keV and $1 \times 10^{15}/cm^2$. Subsequently, Si or Ge ions are implanted thereon under condition that implant energy and dose amount are respectively 30 keV and $1 \times 10^{15}/cm^2$, then the surface of a Si-substrate 1 is perfectly converted into amorphous sate, and an amorphous layer 9 is formed on a Si-substrate 1. Although Si or Ge ions are implanted after P or As ions have been implanted in this embodiment, no problem occurs in case that this order is reversed.

Figure 4C:
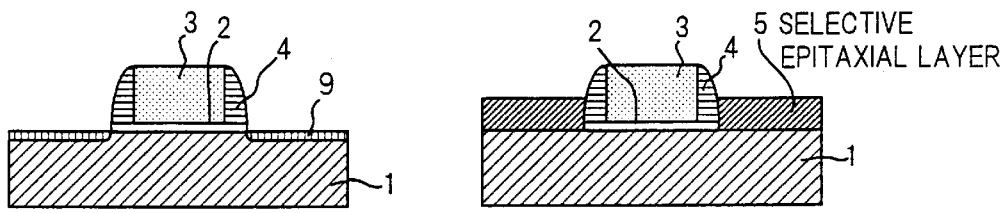

Next, as shown in FIG. 4C, the photoresist 6 is removed, the insulator layer 2 is removed using the gate electrode 3 and the side wall 4 as masks, and a B-doped selective epitaxial layer 5 is grown thereon. In this embodiment, an ultrahigh vacuum chemical vapor deposition (UHV-CVD) apparatus is used. Since the base pressure is lower than 10–9 torr, and a partial vapor pressure of $H_2O$ is low in this apparatus, the epitaxial layer can be grown even at a temperature lower than 400° C. Before the selective epitaxial growth, a natural $SiO_2$ layer is removed by a water solution of HF, and the 500 Å thick selective epitaxial layer 5 doped with B is grown at a temperature of 450° C. Since a Si epitaxial layer is hardly grown at this temperature, Ge of 30% is added to the epitaxial layer. $Si_2H_6$ and $GeH_4$ are used as source gases, and $B_2H_6$ is used as a doping gas. Since the amorphous layer is crystallized at a temperature of about 50° C., the part of the Si substrate 1 corresponding to both the source and drain regions of the n-channel FET are kept to be amorphous during the epitaxial growth. Accordingly, the selective epitaxial layer 5 is not grown on the area corresponding to the n-channel FET, but only on the area corresponding to both the source and drain regions of the p-channel FET.

Figure 4D:
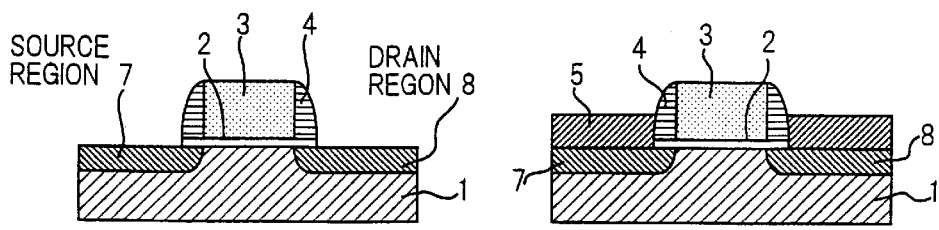

Thereafter, as shown in FIG. 4D, the part of the processed substrate corresponding to both the source and drain regions of the n-channel FET is crystallized by a thermal treatment of 900° C., and B is thermally diffused into the Si substrate 1 to form the source and drain regions, 7 and 8, of the p-channel FET simultaneously with the above-mentioned phenomenon.

The CMOS obtained by the aforementioned process comprises the n-channel FET having the 1500 Å deep source and drain junctions and the p-channel FET having the 1000 Å deep source and drain junctions. Especially, the depth of the p-channel FET is decreased by a factor of ⅓ as compared with the conventional one.

Still more, if dose amount is higher than $1 \times 10^{15}/cm^2$ in case that impurity (P or As) ions are implanted, the surface of the Si-substrate 1 is converted into amorphous state in this step, hence aforementioned implantation of Si or GE ions is omissible.

FIGS. 5A to 5D are cross-sectional views for explaining a fabrication process of a semiconductor device according to the second preferred embodiment of the invention.

Figure 5A:
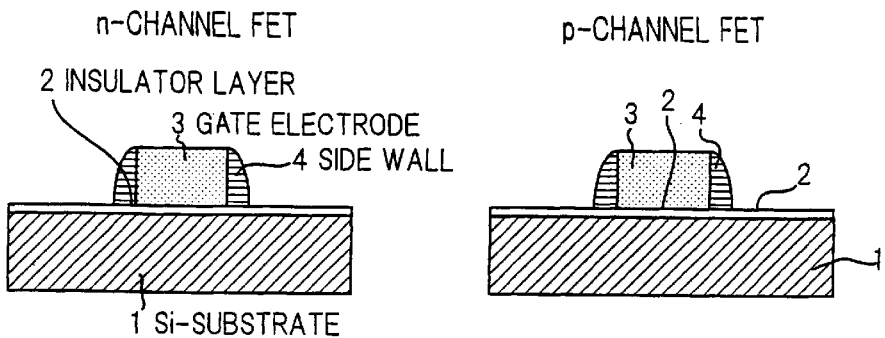
FIGS. 5A to 5D are cross-sectional views for showing a method for fabricating a semiconductor device in the second preferred embodiment of the invention.

As shown in FIG. 5A, insulator layers 2, gate electrodes 3 and side walls 4 have been formed for both n- and p-channel FETs similarly to the conventional process.

Figure 5B:
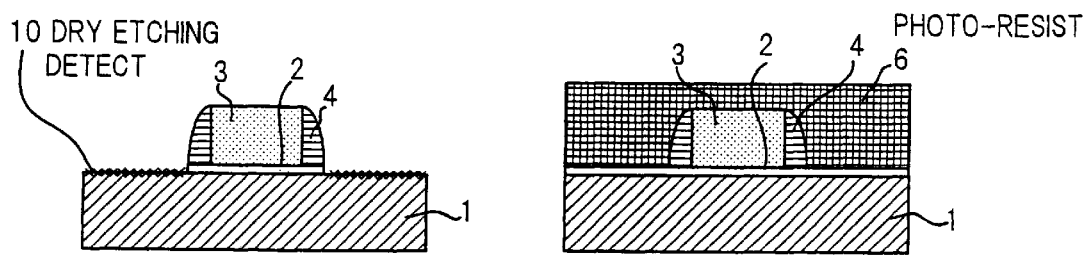

Next, as shown in FIG. 5B, a photoresist 6 is patterned on a surface on a Si-substrate 1 for the p-channel FET so that only an area, on which both source and drain regions of the n-channel FET are to be formed, is exposed, and P or As ions are implanted thereon under condition that implant energy and dose amount are respectively 50 keV and $3 \times 10^{15}/cm^2$.

Furthermore, the insulator layer 2 is removed by dry etching, and dry etching defect 10 is introduced on a part of the Silicon substrate, where both source and drain regions of the n-channel FET are to be formed.

Figure 5C:
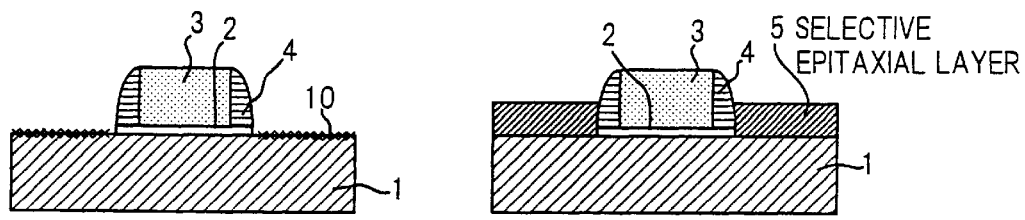

Then, as shown in FIG. 5C, the photoresist 6 is removed, and a B-doped selective epitaxial layer 5 is grown on the Si-substrate 1. In this embodiment, an UHV-CVD apparatus is used for the selective epitaxial growth, also. Before the selective epitaxial growth, a natural $SiO_2$ layer is removed by a water solution of HF, and the B-doped selective epitaxial layer 5 with a thickness of 500 Å is grown at temperature of 650° C. $SiCl_4$ is used as a source gas, and $B_2H_6$ is used as a doping gas. Dry etching defect is not recrystallized at temperature lower than 700° C., and the epitaxial layer is not grown on an area, where both the source and drain regions of the n-channel FET are to be formed, but on an area, where Si-crystal is exposed, in other words, on an area, where both the source and drain regions of the p-channel FET is to be formed.

Figure 5D:
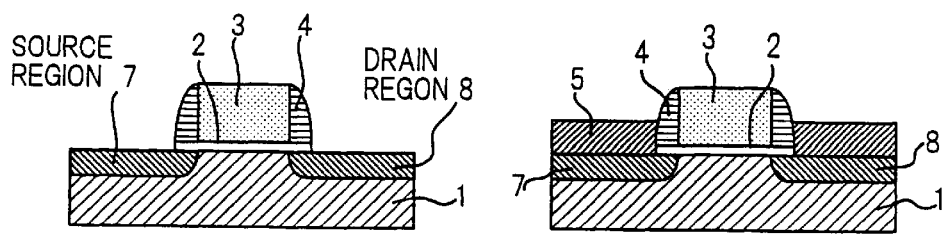

Finally, as shown in FIG. 5D, thermal treatment of 900° C. is applied to a processed substrate and the part of the Si-substrate 1 corresponding to both the source and drain regions of the n-channel FET is crystallized. B is thermally diffused into the Si-substrate 1 from the epitaxial layer 5 for the p-channel FET in parallel with the above-mentioned phenomenon, and the source and drain regions, 7 and 8, are formed.

The CMOS obtained by the aforementioned process comprises the n-channel FET having the 1500 Å deep source and drain junctions and the p-channel FET having the 1000 Å deep source and drain junctions similarly to the case of the first preferred embodiment. Especially, the depths of the junctions the p-channel FET are decreased by a factor of ⅓ as compared with the conventional ones.

As mentioned in the above, in the semiconductor device according to the invention, the shallow source and drain junctions of the p-channel FET in the CMOS can be obtained. Especially, the depths of both the source and drain junctions are reduced to one-third of the conventional ones, that is to say, 3000 Å is reduced to 1000 Å.

Moreover, the steps of photoresist patterning can be decreased by one step.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A method for fabricating a CMOS device comprising:
    forming an insulator layer on a surface of a substrate,
    forming gate electrodes on said insulator layer,
    forming side walls surrounding said gate electrodes,
    exposing only areas surrounding said gate electrodes on said surface of said substrate, where n-type ions are to be implanted, by processing photoresist,
    implanting said n-type impurity ions on said exposed areas on said surface of said substrate,
    amorphizing said exposed areas on said surface of said substrate to inhibit growth of p-type impurity doped epitaxial layers,
    growing p-type impurity doped selective epitaxial layers on areas surrounding said side walls on said surface of said substrate, where p-type impurity ions are to be doped, and
    forming source and drain regions by diffusing said p-type impurity into said surface of said substrate from said p-type impurity doped selective epitaxial layer.

2. A method for fabricating a CMOS device according to claim 1, wherein;
    said substrate is a Si-substrate.

3. A method for fabricating a CMOS device according to claim 2, wherein;
    said p-type impurity is boron.

4. A method for fabricating a CMOS device according to claim 3, wherein;
    said steps of growing said B-doped selective epitaxial layer is carried out at such a low temperature that amorphized regions are not crystallized.

5. A method for fabricating a CMOS device according to claim 3, wherein;
    said steps of growing B-doped selective epitaxial layer is carried out at a temperature lower than 500° C.

6. A method for fabricating a CMOS device according to claim 3, wherein;
    said step of growing said B-doped epitaxial layer is carried out by doping said B-doped epitaxial layer with Ge.

7. A method for fabricating a CMOS device according to claim 1, wherein;
    said step of amorphizing is carried out by implanting Si or Ge ions on said exposed areas.

8. A method for fabricating a CMOS device according to claim 1, wherein;
    said step of amorphizing is carried out by implanting P or As ions on said exposed areas at dose amount higher than $1 \times 10^{15}/cm^2$.

9. A method for fabricating a CMOS device comprising:
    forming an insulator layer on a surface of a substrate,
    forming gate electrodes on said insulator layer,
    forming side walls surrounding said gate electrodes, exposing only areas surrounding said gate electrodes on said surface of said substrate, where n-type impurity ions are to be implanted, by processing photoresists, implanting n-type impurity ions on said exposed areas, introducing dry etching defects to said exposed areas on said surface of said substrate to inhibit growth of p-type impurity doped epitaxial layers, growing p-type impurity doped selective epitaxial layers on areas surrounding said side walls on said surface of said substrate, where p-type impurity ions are to be doped, and forming source and drain regions by diffusing said p-type impurity into said surface of said substrate from said p-type impurity doped selective epitaxial layers.

10. A method for fabricating a CMOS device according to claim 9, wherein;

said substrate is a Si-substrate.

11. A method for fabricating a CMOS device according to claim 10, wherein;

said p-type impurity is boron.

12. A method for fabricating a CMOS device according to claim 11, wherein;

said B-doped selective epitaxial layer is grown at a temperature lower than 700° C.

13. A method for fabricating a CMOS device according to claim 9, wherein;

said step of growing selective epitaxial layers is carried out at such a low temperature that dry etching defects are not crystallized.

14. A method of fabricating a semiconductor device, comprising:

forming gate electrodes with corresponding insulating side walls and insulating portions for at least one n-type FET and for at least one p-type FET;

selectively implanting n-type impurities in a first subset of source/drain regions corresponding to said at least one n-type FET;

selectively treating said first subset of source/drain regions to inhibit growth of a semiconductor layer containing p-type impurities;

selectively growing said layer containing p-type impurities on a second subset of source/drain regions corresponding to said at least one p-type FET, wherein said layer does not grow on said first region; and causing p-type impurities to be diffused into said second subset of source/drain regions.

15. A method, according to claim 14, wherein selectively treating includes amorphizing said first subset of source/drain regions.

16. A method, according to claim 15, wherein amorphizing said first subset includes implanting at least one of: Si and Ge.

17. A method, according to claim 16, wherein implanting includes providing a dose of $1 \times 10^{15}/cm^2$ at 30 keV.

18. A method, according to claim 15, wherein amorphizing includes implanting additional n-type impurities in said first subset of source/drain regions.

19. A method, according to claim 14, wherein selectively treating said first subset of source/drain regions includes introducing dry etching defects thereon.

20. A method, according to claim 14, wherein growing said layer containing p-type impurities includes using an ultrahigh vacuum chemical vapor deposition for epitaxially growing said layer.

21. A method, according to claim 20, wherein epitaxially growing said layer includes using $Si_2H_6$, $GeH_4$, and $B_2H_6$ at a temperature of less than 500 degrees centigrade.

22. A method, according to claim 14, wherein causing p-type impurities to be diffused includes providing a thermal treatment at 900 degrees centigrade.

23. A method, according to claim 14, wherein said gate electrodes with corresponding side walls and insulating portions are formed on an Si substrate having areas that provide said first and second subsets of source/drain regions.

24. A method, according to claim 14, wherein said p-type impurity is boron.

25. A method, according to claim 14, wherein said n-type impurity contains at least one of: P and As.

26. A method, according to claim 14, further comprising:

after causing p-type impurities to be diffused into said second subset of source/drain regions, removing said layer containing p-type impurities.

* * * * *